United States Patent
Sivero et al.

(10) Patent No.: US 6,785,183 B2
(45) Date of Patent: Aug. 31, 2004

(54) SYSTEM FOR CONTROLLING THE STAND-BY TO ACTIVE AND ACTIVE TO STAND-BY TRANSITIONS OF A VCC REGULATOR FOR A FLASH MEMORY DEVICE

(75) Inventors: Stefano Sivero, Vergiate (IT); Riccardo Riva Reggiori, Milan (IT); Fabio Tassan Caser, Milan (IT)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/407,646

(22) Filed: Apr. 3, 2003

(65) Prior Publication Data

US 2004/0052145 A1 Mar. 18, 2004

(30) Foreign Application Priority Data

Sep. 12, 2002 (IT) ..................................... TO2002A0794

(51) Int. Cl.[7] .................................................. G11C 7/00
(52) U.S. Cl. ........................ 365/226; 365/227; 323/316
(58) Field of Search ................................ 365/226, 227; 323/313, 316; 327/541, 54

(56) References Cited

U.S. PATENT DOCUMENTS

| | | | | |
|---|---|---|---|---|
| 5,327,388 A | * | 7/1994 | Kobayashi | ................... 365/226 |
| 5,408,172 A | * | 4/1995 | Tanimoto et al. | ........... 323/273 |
| 5,811,861 A | * | 9/1998 | Nunokawa | ................... 257/379 |
| 5,881,014 A | | 3/1999 | Ooishi | ......................... 365/226 |
| 6,064,188 A | | 5/2000 | Takashima et al. | ......... 323/316 |
| 6,661,279 B2 | * | 12/2003 | Yabe | .......................... 327/546 |

OTHER PUBLICATIONS

K. Ishibashi et al., "A Voltage Down Converter with Sub-microampere Standby Current for Low–Power Static RAM's", *IEEE Journal of Solid State Circuits*, vol. 27, No. 6, p. 920–926, Jun. 1992.

G. W. den Besten, et al., "Embedded 5 V–to–3.3 V Voltage Regulator for Supplying Digital IC's in 3.3 V CMOS Technology", *IEEE Journal of Solid State Circuits*, vol. 33, No. 7, p. 956–962, Jul. 1998.

* cited by examiner

*Primary Examiner*—Son Mai
(74) *Attorney, Agent, or Firm*—Sierra Patent Group, Ltd.

(57) ABSTRACT

A voltage down-converter system, with a stand-by mode and an active mode, for a memory device with the following components. A charge node is configured to receive a charge. A first transistor has a first gate and the first transistor is configured to supply a load current to the memory device. A first switch is coupled to the charge node and the first gate, the first switch being configured to apply the charge in the charge node to the first gate during transition from stand-by to active modes. A second transistor is coupled to the first gate and configured to bias the first transistor to an inactive state during stand-by mode. A second switch is coupled to the first gate and the second transistor, the second switch being configured to apply a voltage difference at the second transistor to the first gate during the stand-by mode.

19 Claims, 4 Drawing Sheets

… … …

SYSTEM FOR CONTROLLING THE STAND-BY TO ACTIVE AND ACTIVE TO STAND-BY TRANSITIONS OF A VCC REGULATOR FOR A FLASH MEMORY DEVICE

PRIORITY CLAIM

This application claims priority to Italian Application Serial Number 2002A000794, filed Sep. 12, 2002.

BACKGROUND OF THE INVENTION

1. Field of the Invention

The invention relates to voltage converters. More particularly, the invention relates to the management and control of an on-chip voltage down-converter that steps down an external power supply to a lower, internal power supply for memory devices.

2. The State of the Art

Semiconductor systems involve circuitry requiring a broad range of power. Microprocessors typically operate at higher voltage levels than memories, for example. In order to make an external power source compatible with both a microprocessor and its memory, for example, the voltage from the external power supply must be down-converted.

FIG. 1 illustrates one example of a prior art voltage down-converter. Amplifier 2 drives the gate of p-channel metal-oxide semiconductor (MOS) transistor 4. The source of transistor 4 connects to external power source 6 and the drain of transistor 4 connects to load circuit 8. The voltage across load circuit 8 drops as current consumption in circuit 8 increases, and when the voltage drops below that of reference generator circuit 10 then amplifier 2 lowers the voltage across the gate of transistor 4. Transistor 4 increases in conductivity as its gate voltage decreases and consequently supplies load circuit 8 with current.

FIG. 2 illustrates another example of a prior art voltage down-converter. N-channel MOS transistor 20 has a low threshold voltage and is configured as a source follower. In one example driver transistor 20 is a natural MOS built on a substrate without a special implant and with a very large aspect ratio (W/L). Replica transistor 22 is coupled to driver transistor 20 and has a smaller aspect ratio than transistor 20. Amplifier 24 and resistors 26 complete a control loop with transistor 22. Amplifier 24 controls the gate of transistor 22 and keeps the voltage at node 28 in a desired range. Consequently transistor 20 provides current through node 30 when voltage at node 28 drops below a predetermined level.

FIG. 3 illustrates a more detailed version of the voltage converter in FIG. 2. Replica circuit 40 has a similar function to that of transistor 22 in FIG. 2. Stand-by circuit 42 and active circuit 44 perform the function of driver transistor 20 in FIG. 2. The prior art voltage converter in FIG. 3 has two operation modes: stand-by and active. In stand-by mode, current leakage to the load is very low. In active mode the transistors are on and provide up to the maximum level of current.

One problem with the aforementioned designs is the need for perfect matching among the driver and reference parts. Another problem is that temperature and process variations must be compensated by the replica circuit. Also, a reference circuit is always on since the follower needs a bias to operate. Finally, problems arise in the prior voltage down-converters while switching between active and stand-by mode. The prior voltage down-converters may fail to achieve a good response to the current step. The prior voltage down-converters may also have dangerous voltage spikes while switching modes.

BRIEF DESCRIPTION OF THE INVENTION

The invention provides a system to manage the switching between active to stand-by transition and stand-by to active transition. The system to manage switching between active and stand-by and stand-by to active modes has two transitions. The first transition is the stand-by to active transition. In one embodiment, the load current for the internal, stepped-down power is initially furnished by a load capacitor, acting as a charge tank, on the internal power node. Prior to entering active mode, a replica transistor for the active mode is biased to charge a capacitor. When the voltage at the internal power supply node drops to a determined level, a switch biases the driver transistor to the node with the capacitor that was charged by the replica transistor, thus activating the driver transistor and increasing the current to the load circuit.

The second transition of the system is the active to stand-by transition. The transition is indicated by the fall of an enable signal. In one embodiment, a delay signal is interjected between the fall of the enable signal and the time at which stand-by mode is entered. The delay signal provides time for a driver transistor gate to be discharged and a node to be charged towards stand-by values. Comparators charge and discharge the gate and node as long as the delay signal is high. A switch disconnects the driver transistor from the power supply node when the enable signal falls so that current stops flowing from the driver transistor while the comparator discharges the gate of the driver transistor. The system enters stand-by mode at the end of the delay signal.

DETAILED DESCRIPTION OF THE INVENTION

Persons of ordinary skill in the art will realize that the following description of the present invention is only illustrative and not in any way limiting. Other embodiments of this invention will be readily apparent to those skilled in the art having benefit of this disclosure.

Figure 1:
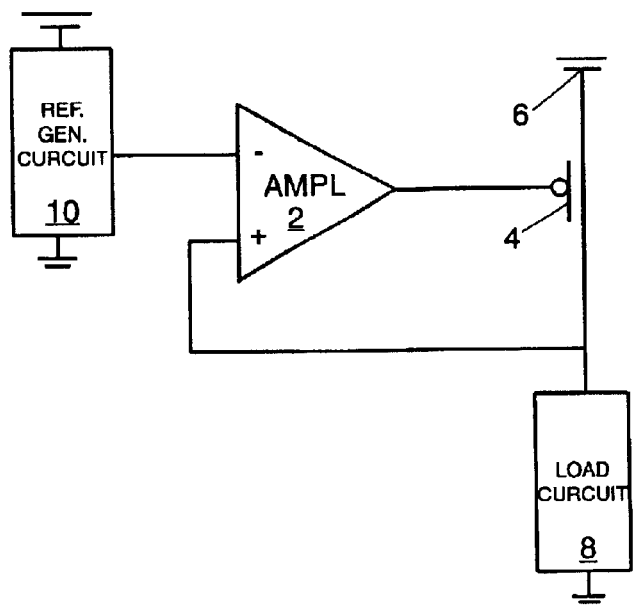
FIG. 1 is a schematic diagram of a prior art voltage down-converter.
Figure 2:
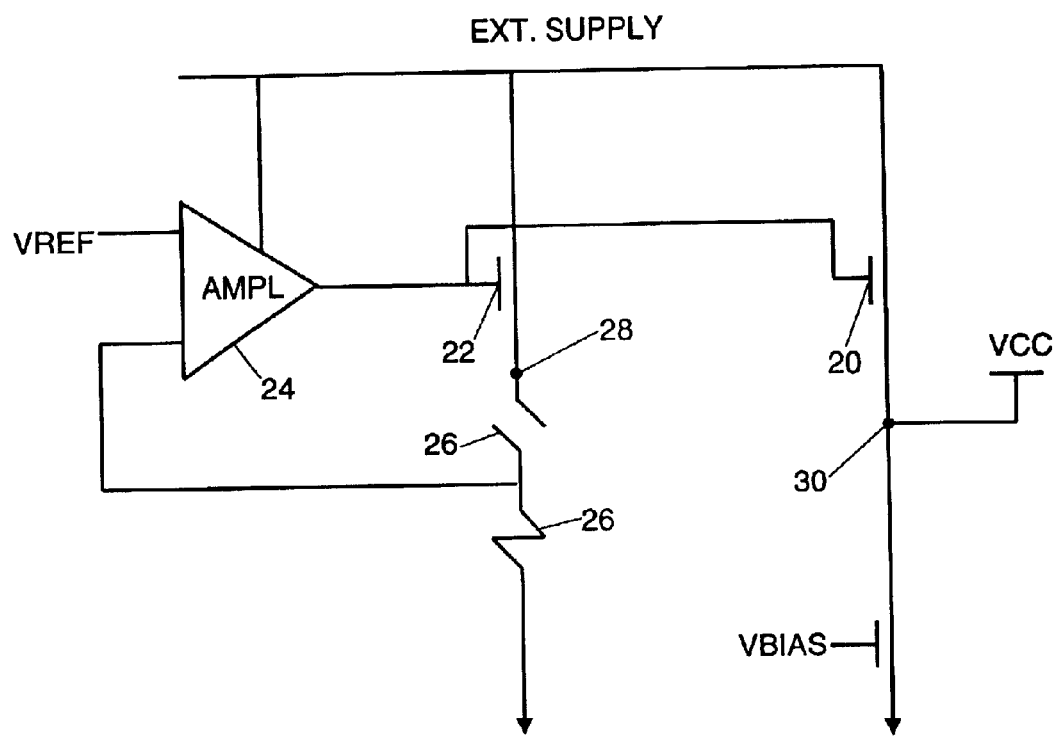
FIG. 2 is a schematic diagram of a prior art voltage down-converter.
Figure 3:
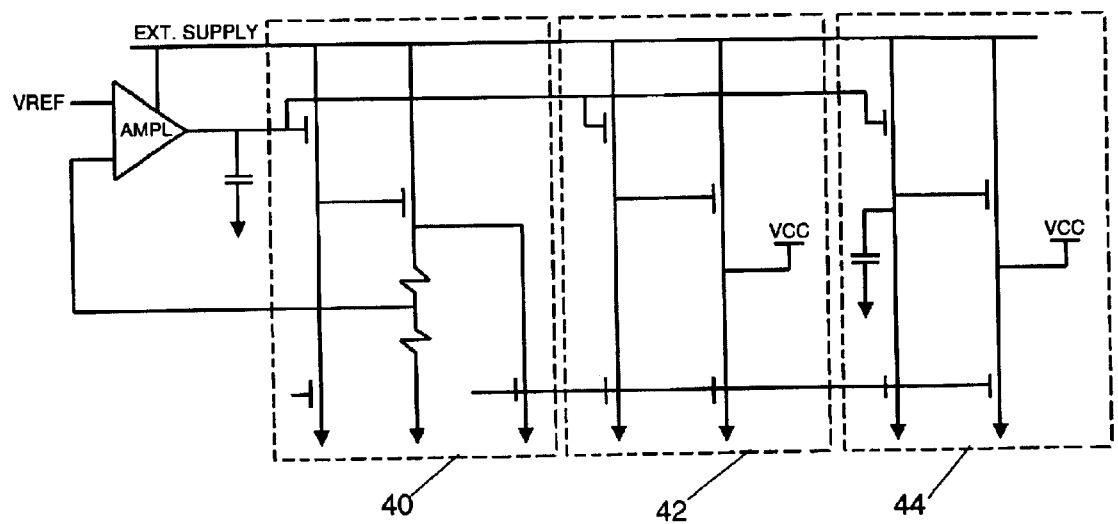
FIG. 3 is a more detailed schematic diagram of the prior art voltage down-converter in FIG. 2
Figure 4:
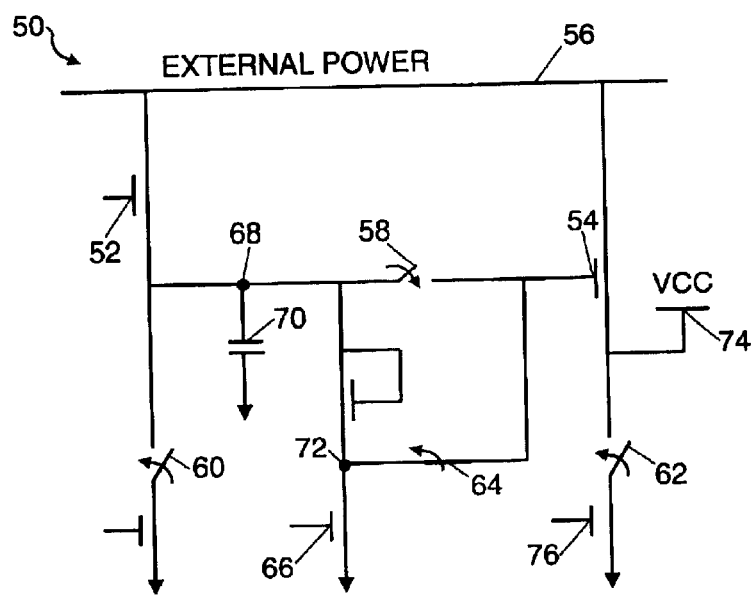
FIG. 4 is a schematic diagram of one part of a voltage down-converter system for transition from stand-by to active modes.

FIG. 4 is a schematic diagram illustrating one embodiment of the invention. Circuit 50 replaces active circuit 44 of FIG. 3 and is provided to illustrate the transition from stand-by to active mode. Transistor 52 serves as a replica transistor while transistor 54 serves as a driver. External power supply 56 couples to both transistors 52 and 54. In stand-by mode, switches 58, 60 and 62 are off, while switch 64 is on. One of ordinary skill in the art will appreciate that a switch conducts electricity when on and does not conduct electricity when off. Transistor 52 is biased by current from transistor 66 and charges node 68, which in one embodiment includes capacitor 70, to approximately 2V. In one embodiment capacitor 70 is 400 pF. Node 72 is kept one threshold lower, or approximately 800 mV. The gate of transistor 54 is therefore 800 mV lower than its source, which is coupled to internal voltage source VCC 74, and therefore off. Additionally, switch 62 prevents current from flowing through transistor 54 to the load circuit (not shown). In one embodiment, transistors in the invention are p-channel MOS transistors.

Switches 58, 60 and 62 are turned on and switch 64 turns off in order to transition to active mode. Transistor 54 is decoupled from node 72 and is coupled to node 68, which is at approximately 2V. Transistor 54 activates and may conduct current through the now coupled transistor 76 to the load circuit (not shown). With switches 58, 60 and 62 on, and switch 64 off, circuit 50 is in active mode.

Figure 5:
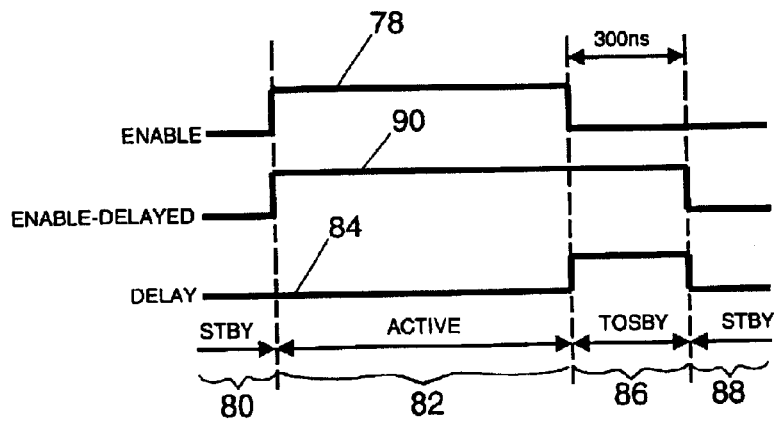
FIG. 5 is a diagram of timing signals used for transition from active to stand-by modes.

FIG. 5 illustrates a timing diagram with enable, delay and enable-delayed signals. Enable signal 78 is low during stand-by mode 80. Enable signal 78 rises to communicate the transition from stand-by mode 80 to active mode 82. In the prior art, a falling enable signal would communicate the transition from active to stand-by mode. The invention provides a delay before transitioning from active to stand-by modes. In one embodiment, the delay is approximately 300 ns. Delay signal 84 is high during to-stand-by mode 86 and off in stand-by mode 88. Enable-delayed signal 90 rises at the beginning of active mode 82 and remains high until the end of to-stand-by mode 86.

Figure 6:
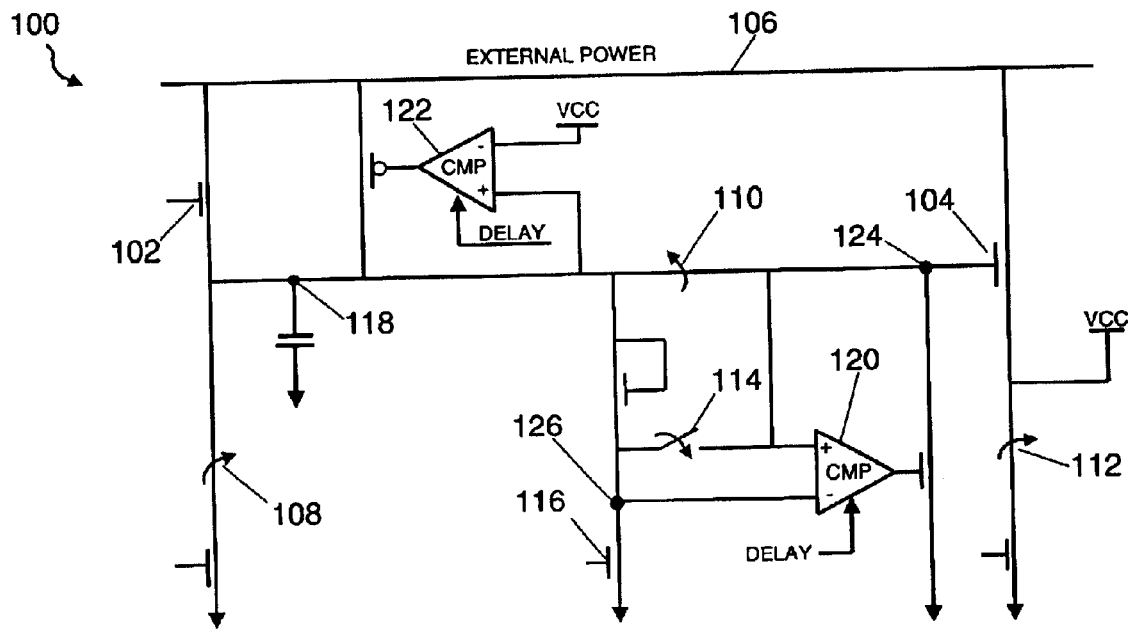
FIG. 6 is a detailed schematic diagram of the system in FIG. 4 including circuitry for transition from active to stand-by modes.

FIG. 6 is a schematic diagram illustrating one embodiment of the invention. FIG. 6 is a more detailed illustration of the circuit illustrated in FIG. 4. Circuit 100 replaces active circuit 44 of FIG. 3 and is provided to illustrate the transition from active to stand-by mode. Transistor 102 serves as a replica transistor while transistor 104 serves as a driver. External power 106 couples to both transistors 102 and 104. In active mode, switches 108, 110 and 112 are on, while switch 114 is off. When the circuitry (not shown) associated with system 100 receives a low input from enable signal 78 (shown in FIG. 5), switches 108, 110, and 112 turn off. Switch 114 is off during active mode 82 and remains off until the fall of enable-delayed signal 90 (i.e., switch 114 remains off until stand-by mode 88), at which time switch 114 turns on. Current from transistor 116 biases transistor 102. Node 118 is disconnected from the gate of transistor 104.

Comparators 120 and 122 are activated during to-stand-by mode 86 (shown in FIG. 5) with delay signal 84. With switches 110 and 114 off during to-stand-by mode 86, comparator 120 compares the voltage at node 124 with node 126 and discharges node 124 toward ground as long as the potential at node 124 is greater than that at node 126. Comparator 122 charges node 118 toward a predetermined value, which in one embodiment is approximately 2V. When enable-delayed signal 90 falls at the end of to-stand-by mode 86 (see FIG. 5), switch 114 turns on and couples the gate of transistor 104 to node 126 and shuts off transistor 104.

Figure 7:
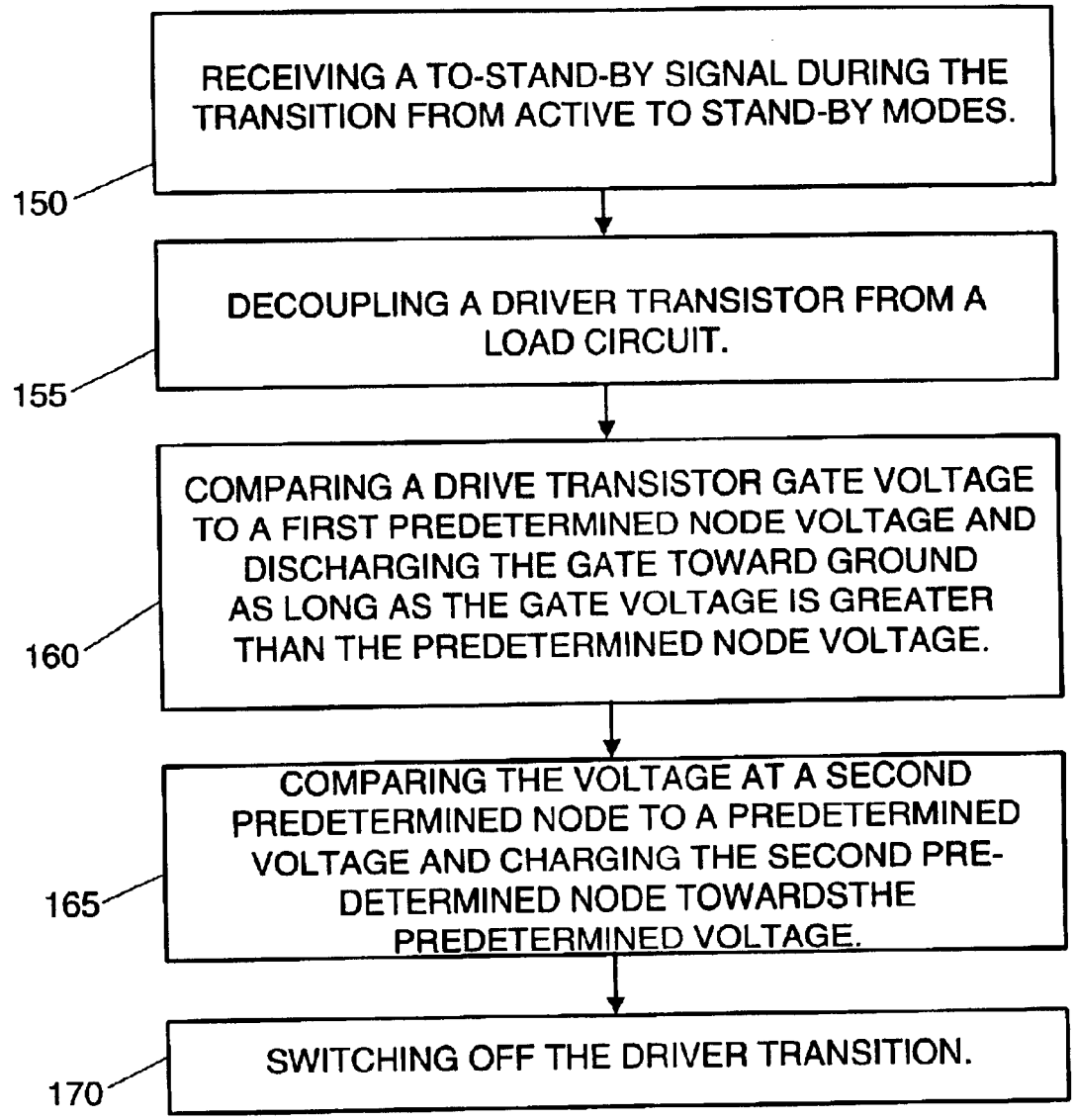
FIG. 7 is a flow diagram illustrating a method of transitioning from active to stand-by modes according to one embodiment of the invention.

FIG. 7 is a flow diagram illustrating the method of transitioning from active to stand-by modes. In block 150, receiving a to-stand-by signal during the transition from active to stand-by modes. In block 155, decoupling a driver transistor from a load circuit. In block 160, comparing a driver transistor gate voltage to a first predetermined node voltage and discharging the gate toward ground as long as the gate voltage is greater than the predetermined node voltage. In block 165, comparing the voltage at a second predetermined node to a predetermined voltage and charging the second predetermined node towards the predetermined voltage. In block 170, switching off the driver transistor.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A voltage down-converter system, having a stand-by mode and an active mode, for a memory device comprising:

a charge node configured to receive a charge;

a first transistor having a first gate, the first transistor coupled to the memory device and configured to supply a load current to the memory device;

a first switch coupled to the charge node and the first gate, the first switch configured to apply the charge in the charge node to the first gate during a transition from stand-by to active modes;

a second transistor coupled to the first gate; and a second switch coupled to the first gate and the second transistor, the second switch configured to apply a voltage potential to the first gate during the stand-by mode and bias the first transistor to an inactive state.

2. The system of claim 1 further comprising:

a third transistor coupled to the charge node and configured to be biased by the second transistor and to charge the charge node during stand-by mode.

3. The system of claim 2 further comprising:

a third switch coupled to the first transistor and to the memory device and configured to prevent load current flow through the first transistor to the memory device during stand-by mode and allow load current flow through the first transistor to the memory device during active mode.

4. The system of claim 3 wherein:

the first transistor and the second transistor are each coupled to an external power supply.

5. The system of claim 4 wherein:

the first transistor is coupled to an internal voltage source.

6. The system of claim 4 wherein:

the charge node is a capacitor.

7. A voltage down-converter system, having a stand-by mode and an active mode, for a memory device comprising:

a first charge node configured to receive a first charge;

a first comparator coupled to the first charge node and configured to receive a signal and while receiving the signal to compare the first charge to ground and discharge the first charge node towards ground;

a second charge node configured to receive a second charge; and a second comparator coupled to the second charge node and configured to receive the signal and while receiving the signal to compare the second charge to a reference voltage and charge the second charge node towards the reference voltage.

8. The system of claim 7 further comprising:

a first transistor having a gate, the first transistor coupled to the first charge node and coupled to the memory device and configured to supply a load current to the memory device.

9. The system of claim 8 further comprising:

a first switch coupled to the gate and the second charge node.

10. The system of claim 9 wherein:

the first switch is configured to turn off at the end of the transition from active mode to stand-by mode and electrically decouple the gate and the second charge node.

11. The system of claim 10 further comprising:

a second switch coupled to the first transistor and the memory device and configured to turn off at the end of the transition from active mode to stand-by mode.

12. The system of claim 11 wherein:

the first charge node is coupled to a second transistor.

13. The system of claim 12 wherein:

the second charge node is coupled to a capacitor.

14. The system of claim 13 wherein:

the signal is transmitted to the system during the transition from active mode to stand-by mode.

15. The system of claim 14 wherein:

the signal lasts for approximately 300 ns.

16. A method of transitioning from an active mode to a stand-by mode in a voltage down-converter system for a memory device comprising:

receiving a to-stand-by signal during the transition from active to stand-by modes; and comparing a drive transistor gate voltage to a first predetermined node voltage and discharge the gate toward ground as long as the gate voltage is greater than the predetermined node voltage.

17. The method of claim 16 further comprising:

comparing the voltage at a second predetermined node to a predetermined voltage and charge the second predetermined node towards the predetermined voltage.

18. The method of claim 17 further comprising:

decoupling a driver transistor from a load circuit.

19. The method of claim 18 further comprising:

switching off a driver transistor.

* * * * *